US008667341B2

(12) United States Patent
Han et al.

(10) Patent No.: US 8,667,341 B2
(45) Date of Patent: Mar. 4, 2014

(54) APPARATUS AND METHOD FOR DETERMINING INTERLEAVED ADDRESS OF TURBO INTERLEAVER

(75) Inventors: Jin Wook Han, Anyang-si (KR); Yong Chan Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 379 days.

(21) Appl. No.: 12/854,528

(22) Filed: Aug. 11, 2010

(65) Prior Publication Data

US 2011/0041042 A1 Feb. 17, 2011

(30) Foreign Application Priority Data

Aug. 11, 2009 (KR) ........................ 10-2009-0073744

(51) Int. Cl.
*G11C 29/00* (2006.01)
(52) U.S. Cl.
USPC ........................................................ 714/702
(58) Field of Classification Search
USPC .................. 714/701, 702, 752, 755, 786, 795; 341/81; 711/157
See application file for complete search history.

(56) References Cited

U.S. PATENT DOCUMENTS

| 7,155,642 | B2 * | 12/2006 | Han ............................... 714/701 |
| 7,170,432 | B2 * | 1/2007 | Ettorre ............................ 341/81 |
| 7,398,446 | B2 * | 7/2008 | Garrett et al. .................. 714/755 |
| 7,552,377 | B1 * | 6/2009 | Jones ............................. 714/759 |
| 2004/0220988 | A1 * | 11/2004 | Barry et al. ..................... 708/446 |

* cited by examiner

*Primary Examiner* — Scott Baderman
*Assistant Examiner* — Joseph Kudirka
(74) *Attorney, Agent, or Firm* — The Farrell Law Firm, P.C.

(57) ABSTRACT

An apparatus and method for determining interleaved addresses of a turbo interleaver are disclosed. A new interleaving size of received data is compared with a previously-stored interleaving size. When the compared interleaving sizes are equal to each other, the received data is decoded using previously-stored interleaved addresses. When the compared interleaving sizes are different from each other, the received data is decoded using new interleaved addresses generated with the new interleaving size. The turbo interleaver generates interleaved addresses at minimum number of code blocks rather than every code block, resulting in reduction of decoding delay and improvement of decoding performance.

12 Claims, 9 Drawing Sheets

FIG. 7
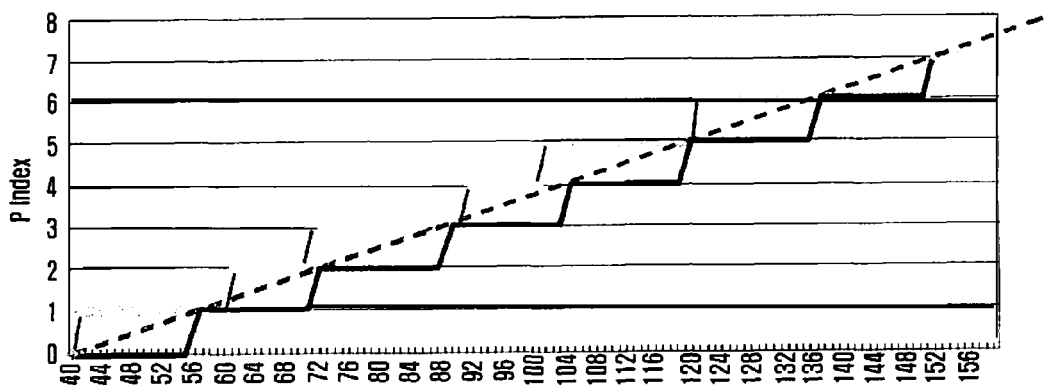
(a)
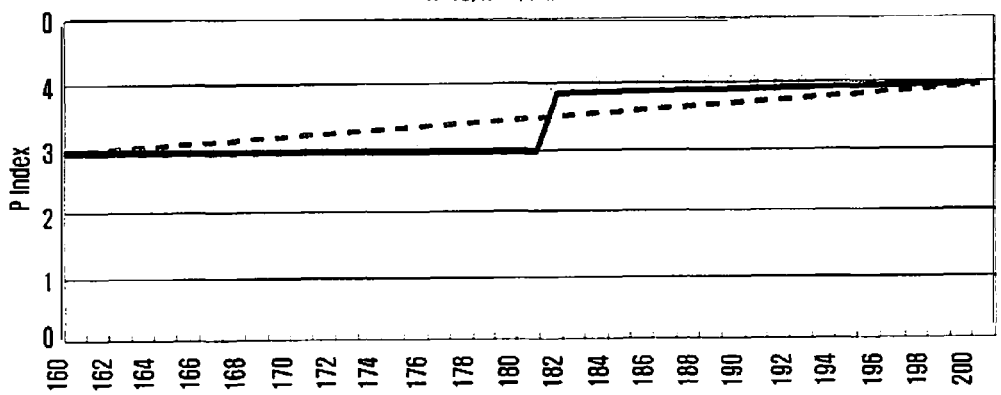
(b)
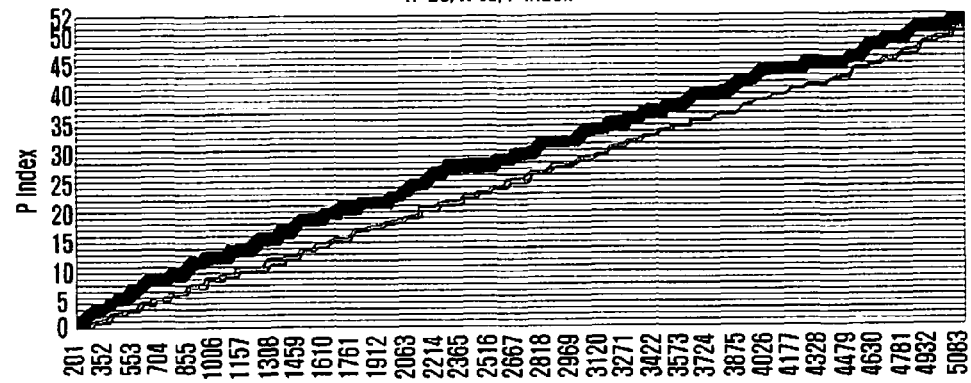
(c)

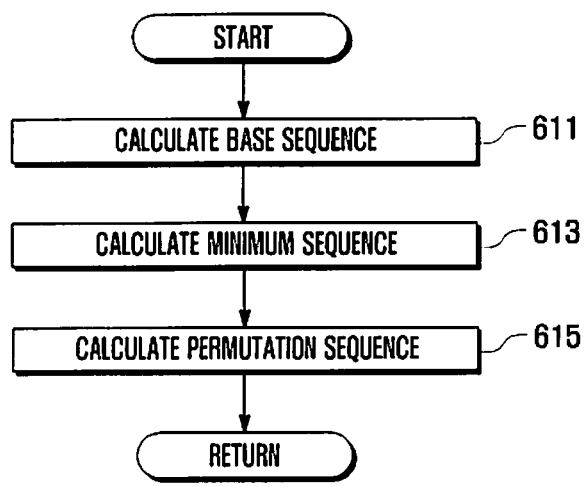
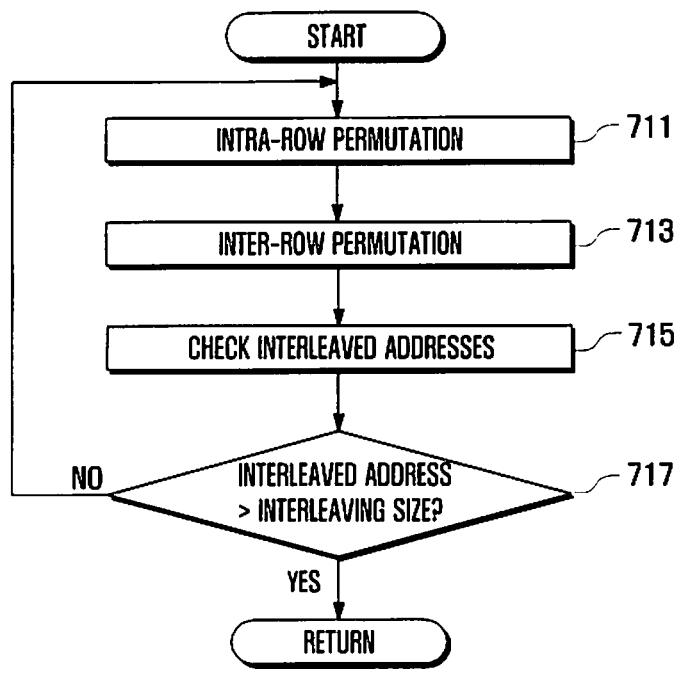

APPARATUS AND METHOD FOR DETERMINING INTERLEAVED ADDRESS OF TURBO INTERLEAVER

PRIORITY

This application claims priority under 35 U.S.C. §119(a) to an application filed in the Korean Intellectual Property Office on Aug. 11, 2009, and assigned Serial No. 10-2009-0073744, the contents of which are incorporated herein by reference.

BACKGROUND OF THE INVENTION

1. Field of the Invention

The present invention relates generally to mobile communications and, in particular, to an apparatus and method for determining interleaved addresses of a turbo interleaver in a mobile communication system.

2. Description of the Related Art

In mobile communication systems that are based on standards such as Wideband Code Division Multiple Access (WCDMA) and High Speed Downlink Packet Access (HSDPA) of $3^{rd}$ Generation Partnership Project (3GPP), channel encoders (such as, viterbi encoders and turbo encoders) and channel decoders (such as, viterbi decoders and turbo decoders) are used in order to effectively remove noises on the communication channel. For example, the transmitter performs encoding on the transmission data by means of a turbo encoder and the receiver performs decoding on the received data by means of a turbo decoder, in a digital communication system.

In order to improve encoding and decoding performance, the turbo encoder and decoder are implemented with a turbo interleaver. The turbo interleaver generates as many interleaved addresses as defined by the interleaver size. The turbo encoder (or decoder) performs encoding (or decoding) on the data with the interleaved addresses. The turbo decoder operates a Transmission Time Interval (TTI) unit composed of a plurality of code blocks as shown in FIG. 1.

In such a turbo decoder, the turbo interleaver generates the interleaved addresses for every code block as depicted in FIG. 1, and, as a consequence, causes decoding delay of the turbo decoder.

SUMMARY OF THE INVENTION

The present invention has been made to address at least the above problems and/or disadvantages and to provide at least the advantages described below. Accordingly, an aspect of the present invention provides an apparatus and method for determining interleaved addresses of the turbo interleaver that is capable of reducing decoding delay at the turbo decoder.

According to one aspect of the present invention, a method for determining interleaved addresses of a turbo interleaver is provided. A new interleaving size of received data is compared with a previously-stored interleaving size. When the compared interleaving sizes are equal to each other, the received data is decoded using previously-stored interleaved addresses. When the compared interleaving sizes are different from each other, the received data is decoded using new interleaved addresses generated with the new interleaving size.

According to another aspect of the present invention, an apparatus is provided for determining interleaved addresses of a turbo interleaver. The apparatus includes a size comparator that compares a new interleaving size of received data with a previously-stored interleaving size. The apparatus also includes an address determiner which decodes the received data using previously-stored interleaved addresses when the compared interleaving sizes are equal to each other, and decodes the received data using new interleaved addresses generated with the new interleaving size when the compared interleaving sizes are different from each other.

BRIEF DESCRIPTION OF THE DRAWINGS

The above and other aspects, features and advantages of the present invention will be more apparent from the following detailed description in conjunction with the accompanying drawings, in which:

FIGS. 7(*a*)-(*c*) are graphs for explaining the prime number search process of FIG. 6, according to an embodiment of the present invention;

FIG. 8 is a flowchart illustrating steps of the interleaving sequence generation process of FIG. 5, according to an embodiment of the present invention;

FIG. 9 is a flowchart illustrating steps of the interleaved address generation process of FIG. 5, according to an embodiment of the present invention;

DETAILED DESCRIPTION OF EMBODIMENTS OF THE PRESENT INVENTION

Embodiments of the present invention are described in detail with reference to the accompanying drawings. The same or similar reference numbers may be used throughout the drawings to refer to the same or similar components. Detailed descriptions of constructions or processes known in the art may be omitted to avoid obscuring the subject matter of the present invention.

Figure 1:
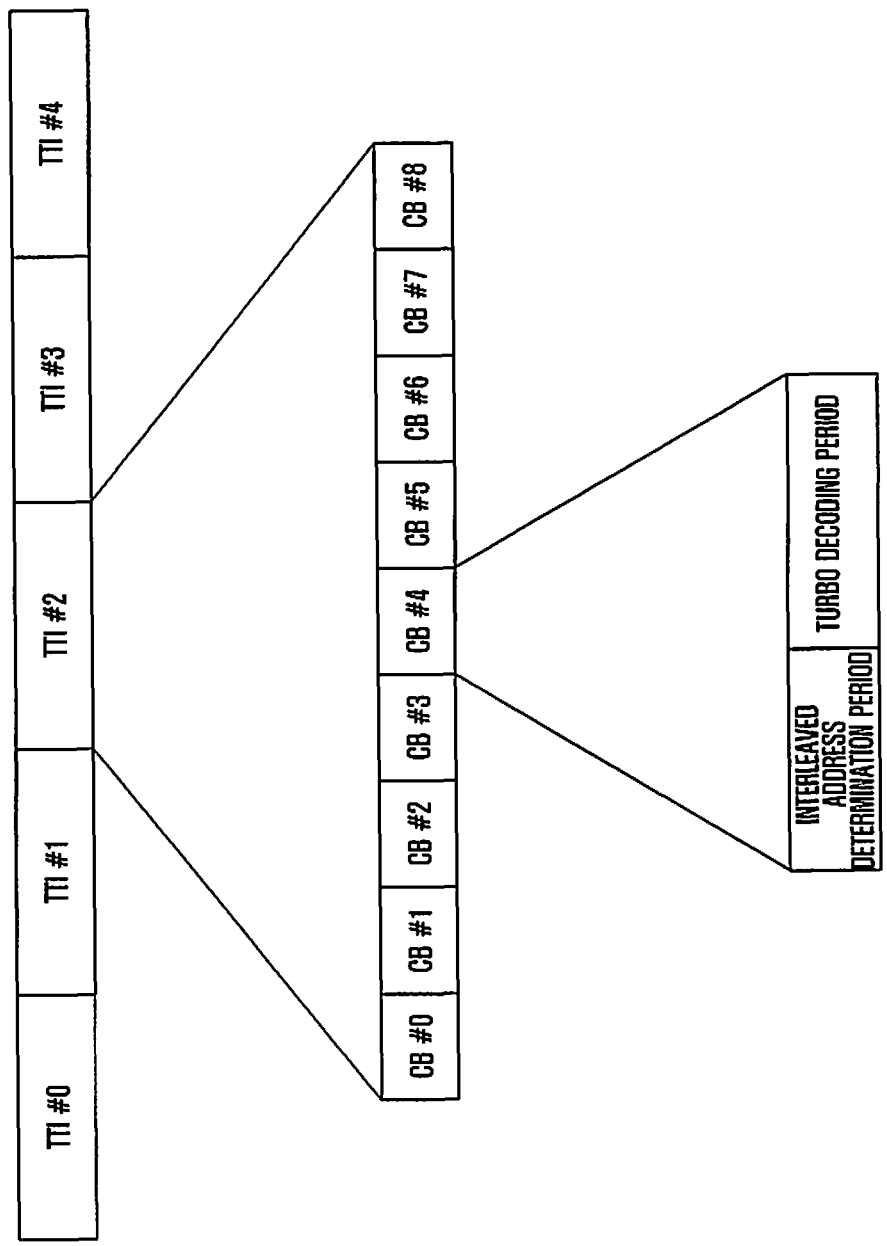
FIG. 1 is a diagram illustrating a structure of turbo decoding data in the conventional digital communication system.
Figure 2:
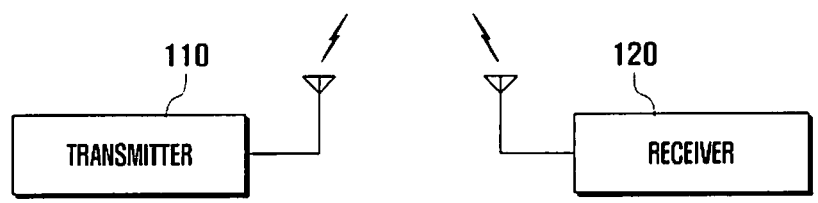
FIG. 2 is a schematic diagram illustrating a digital communication system, according to an embodiment of the present invention.

FIG. 2 is a schematic diagram illustrating a digital communication system, according to an embodiment of the present invention. In an embodiment of the present invention, the digital communication system can be a WCDMA system or a HSDPA system.

As shown in FIG. 2, the digital communication system includes a transmitter 110 and a receiver 120. The transmitter 110 encodes transmission data and transmits the encoded data over a transmission channel. The receiver 120 receives the data over the transmission channel and decodes the received data. The digital communication system is implemented to effectively remove noise on the transmission channel. In order to remove the transmission channel noise, the transmitter 110 is provided with a turbo encoder, and the receiver 120 is provided with a turbo decoder.

Figure 3:
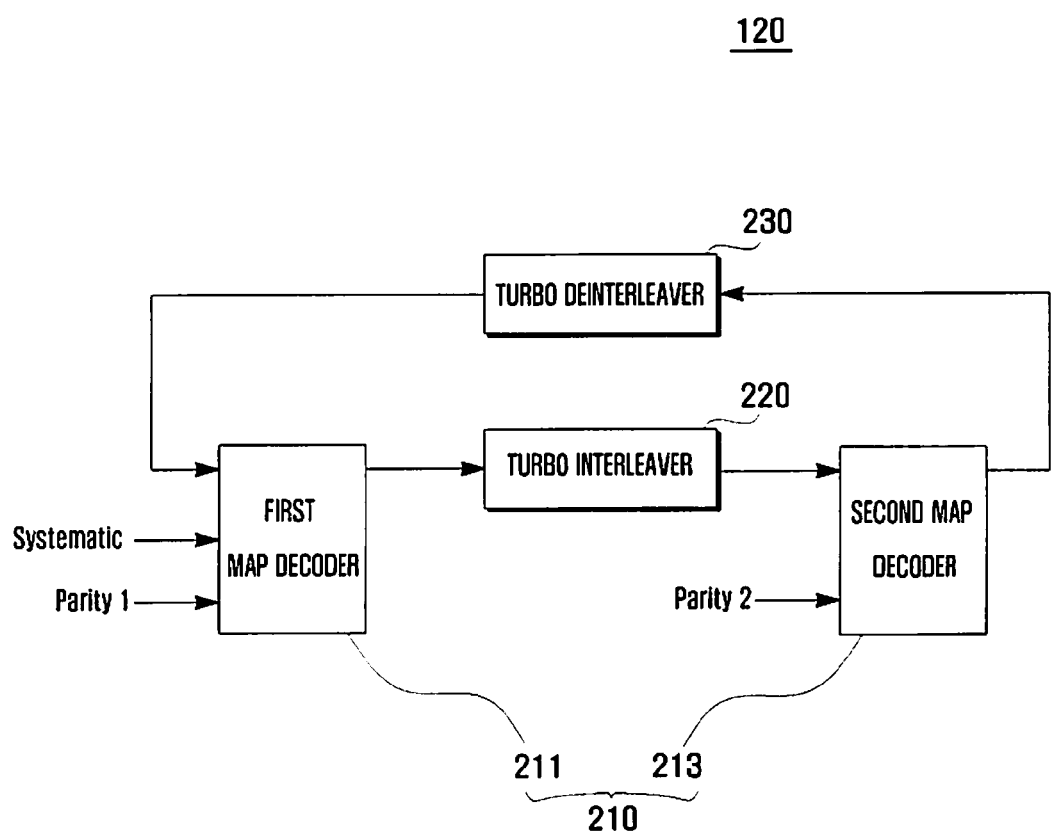
FIG. 3 is a block diagram illustrating a configuration of a turbo decoder, according to an embodiment of the present invention.

FIG. 3 is a block diagram illustrating a configuration of a turbo decoder, according to an embodiment of the present invention. In this embodiment, it is assumed that the turbo decoder uses Maximum A Posterior (MAP) algorithm.

Referring to FIG. 3, the decoder of the receiver 120 includes a MAP decoding mechanism 210 having a first MAP decoder 211 and a second MAP decoder 213, a turbo interleaver 220, and a turbo deinterleaver 230. The MAP decoders 211 and 213 are responsible for decoding data. The first MAP decoder 211 performs decoding on the data input in series, which includes systematic components and parity components. The turbo interleaver 220 determines interleaved addresses for the input data. The turbo interleaver 220 performs interleaving on the output of the first MAP decoder 211 with the interleaved addresses so as to change the arrangement order of the data. The second MAP decoder 213 performs decoding on the interleaved data output by the turbo interleaver 220. The turbo deinterleaver 230 performs deinterleaving on the output of the second MAP decoder 213 with the interleaved address to recover the original arrangement order of the data.

The turbo decoder operates in a TTI unit and performs decoding on the data received in a series of TTIs. In an embodiment of the present invention, the turbo interleaver 220 selectively determines interleaved addresses in a specific code block. Specifically, when the interleaved addresses are changed between two TTIs or two blocks, the turbo interleaver 220 determines interleaved addresses.

Figure 4:
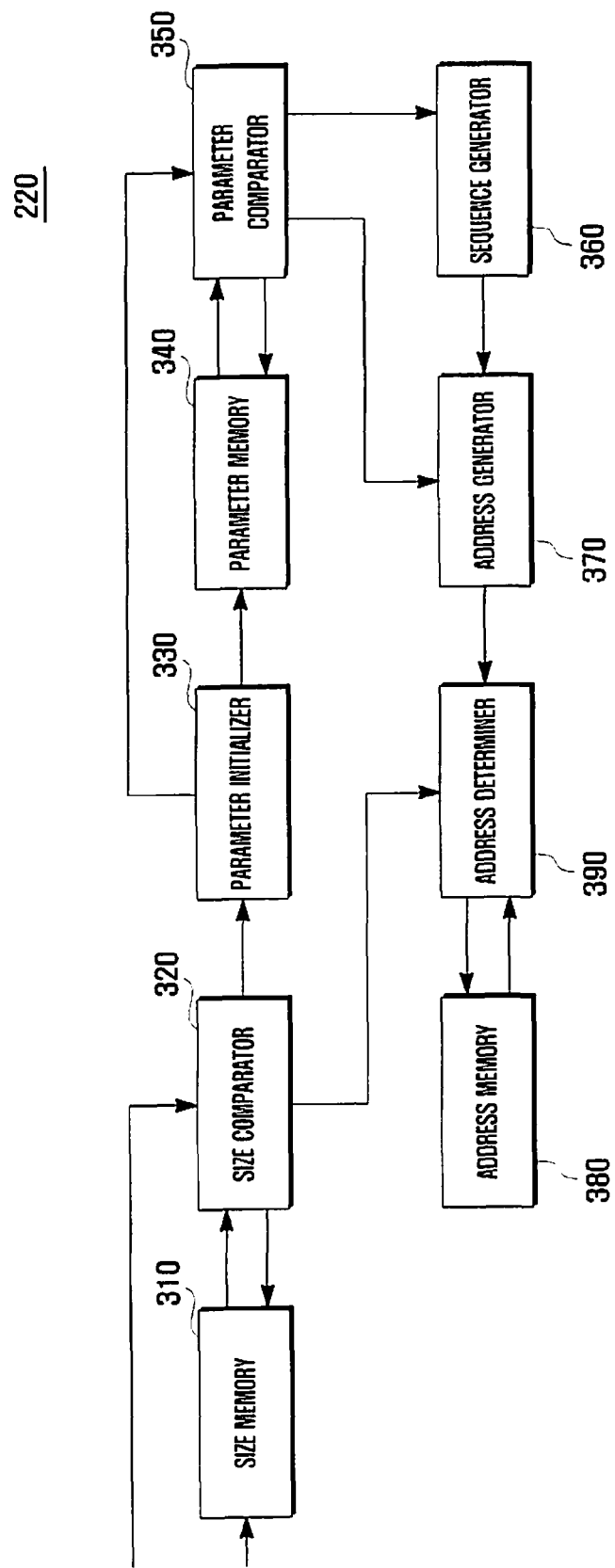
FIG. 4 is a block diagram illustrating a configuration of an interleaved address determination unit of the turbo interleaver, according to an embodiment of the present invention.

FIG. 4 is a block diagram illustrating a configuration of an interleaved address determination unit of the turbo interleaver, according to an embodiment of the present invention.

As shown in FIG. 4, the interleaved address determination unit of the turbo interleaver includes a size memory 310, a size comparator 320, a parameter initializer 330, a parameter memory 340, a parameter comparator 350, a sequence generator 360, an address generator 370, an address memory 380, and an address determiner 390.

The size memory 310 stores an interleaving size (K) of the received data. The interleaving size can be determined as a length of a code block. Specifically, the interleaving size denotes a number of bits that can be decoded at a time.

The size comparator 320 checks the interleaving size of the received data, i.e. new interleaving size. The size comparator compares the new interleaving size and the old interleaving size stored in the size memory 310. The size comparator 320 determines whether the new interleaving size is equal to the old interleaving size stored in the size memory 310. If the two interleaving sizes differ from each other, the size comparator 320 updates the old interleaving size with the new interleaving size.

The parameter initializer 330 calculates an interleaving parameter with the new interleaving size of the currently received data. If it is determined at the size comparator 320 that the new interleaving size differs from the old interleaving size stored in the size memory 310, the parameter initializer 330 calculates interleaving parameters for a rectangular matrix (or original matrix) to be formed with the received data. The interleaving parameters include a number of rows, a number of columns, a prime number (p), and a primitive root (v) of the rectangular matrix.

The parameter memory 340 stores at least one of the interleaving parameters. The parameter memory 340 can selectively store the number of rows and the number of columns.

The parameter comparator 350 checks the interleaving parameters output by the parameter initializer 330, i.e., new interleaving parameters. The parameter comparator 350 also compares the new interleaving parameters and the old interleaving parameters stored in the parameter memory 340. The parameter comparator 350 determines whether the new interleaving parameters are equal to the old interleaving parameters stored in the parameter memory 340. If the new interleaving parameters are not equal to the old parameters stored in the parameter memory 340, the parameter comparator 350 updates the old interleaving parameters with the new interleaving parameters.

The sequence generator 360 generates interleaving sequences with new interleaving parameters. If it is determined, at the parameter comparator 350, that the new interleaving parameters are not identical with the old interleaving parameters stored in the memory, the sequence generator 360 generates new interleaving sequences with the new interleaving parameters in the rectangular matrix. The interleaving sequences include a base sequence ($s_j$ sequence), a minimum prime sequence ($q_i$ sequence), and a permuted prime≤sequence ($r_i$ sequence). The sequence generator 360 stores the interleaving sequences. Although not depicted, the sequence generator 360 can be provided with a sequence memory for storing the interleaving sequences. The sequence memory can be implemented separately from the sequence generator 360.

The address generator 370 generates interleaved addresses according to the interleaving sequences in the rectangular matrix. The address generator 370 performs at least one of intra-row permutation and inter-row permutation in the rectangular matrix according to the interleaving sequences, and checks the interleaved address from the permutation result. The address generator 370 can perform pruning to recheck the interleaved address. The address generator 370 determines whether to perform pruning based on the comparison result between the interleaved address and interleaving size. If the interleaved address is longer than the interleaving size, the address generator 370 performs pruning on the interleaved address.

The address memory 380 stores the interleaved address of the received data.

The address determiner 390 determines the interleaved addresses of the currently received data, i.e., new interleaved addresses. The address determiner 390 determines ones of the interleaved addresses provided by the address generator 370 and the address memory 380 as the current interleaved address. Specifically, if the new interleaving size is different from the old interleaving size stored in the size memory 310, the address determiner 390 determines the new interleaved addresses generated by the address generator 370 as the current interleaved addresses. Otherwise, if the new interleaving size is identical with the old interleaving size stored in the size memory 310, the address determiner 390 determines the old interleaved addresses stored in the address memory 380 as the current interleaved addresses. The address determiner 390 updates the old interleaved addresses in the address memory 380 with the new interleaved address.

Figure 5:
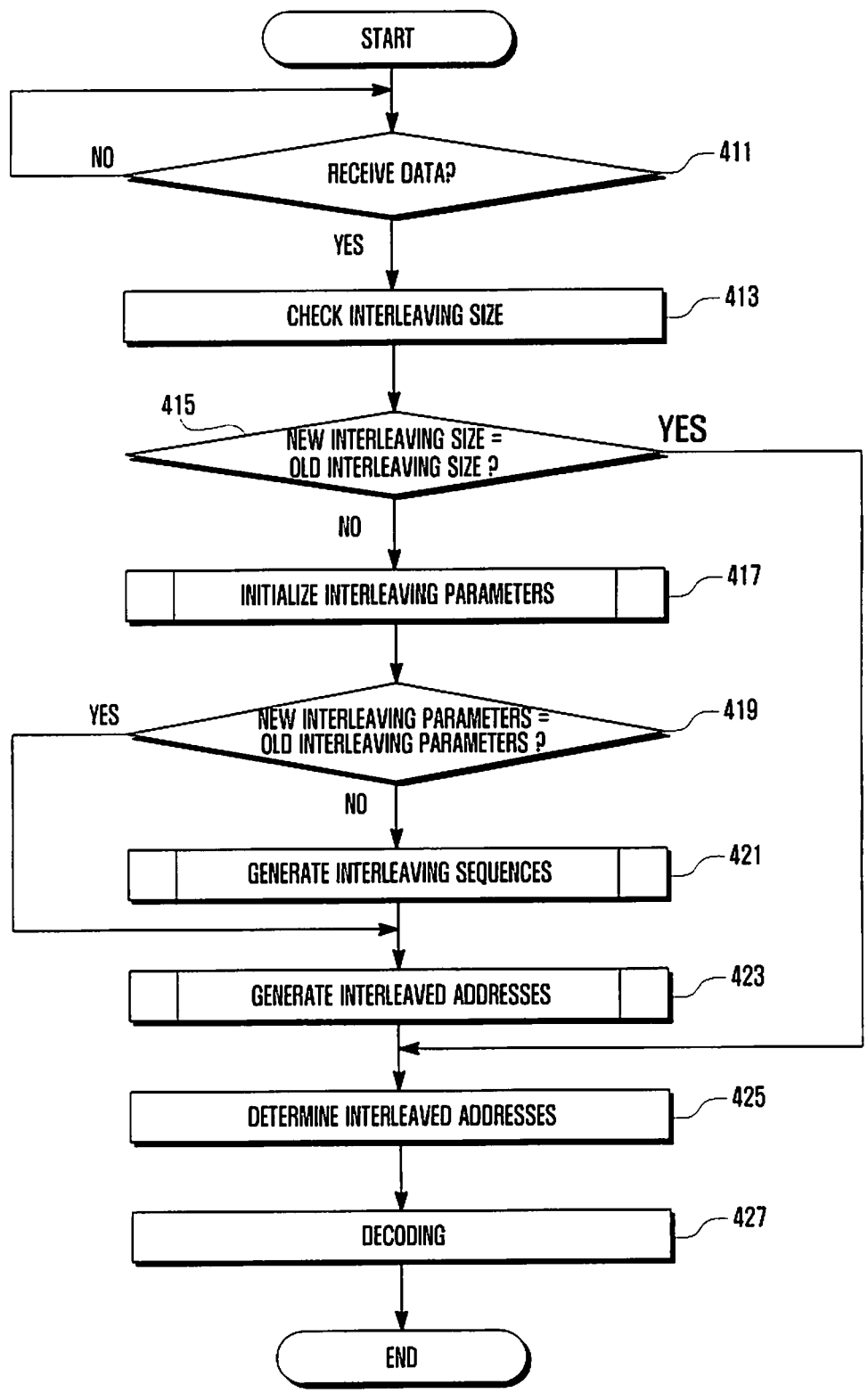
FIG. 5 is a flowchart illustrating a procedure for determining an interleaved address of a turbo interleaver, according to an embodiment of the present invention.

FIG. 5 is a flowchart illustrating a procedure for determining an interleaved address of a turbo interleaver, according to an embodiment of the present invention.

Referring to FIG. 5, in the interleaved address determination procedure, the turbo decoder monitors to detect receipt of data in step 411. The turbo decoder detects receipt of data when a predetermined amount of data is buffered in a buffer. If data reception is detected, then the turbo interleaver 220 of the turbo decoder checks a new interleaving size of the received data in step 413. The size comparator 320 of the turbo interleaver 220 compares the new interleaving size with the old interleaving size stored in the size memory 310 to determine whether the two interleaving sizes are equal to each other in step 415.

If it is determined that the two interleaving sizes are different from each other at step 415, the parameter initializer 330 of the turbo interleaver 220 calculates with the new interleaving size and initializes the interleaving parameters in step 417. The size comparator 320 also updates the old interleaving size stored in the size memory 310 with the new interleaving size. The parameter initializer 330 calculates new interleaving parameters for the rectangular matrix to be formed with the received data. The interleaving parameters include a number of rows, a number of columns, a prime number, and a primitive root of the rectangular matrix.

Figure 6:
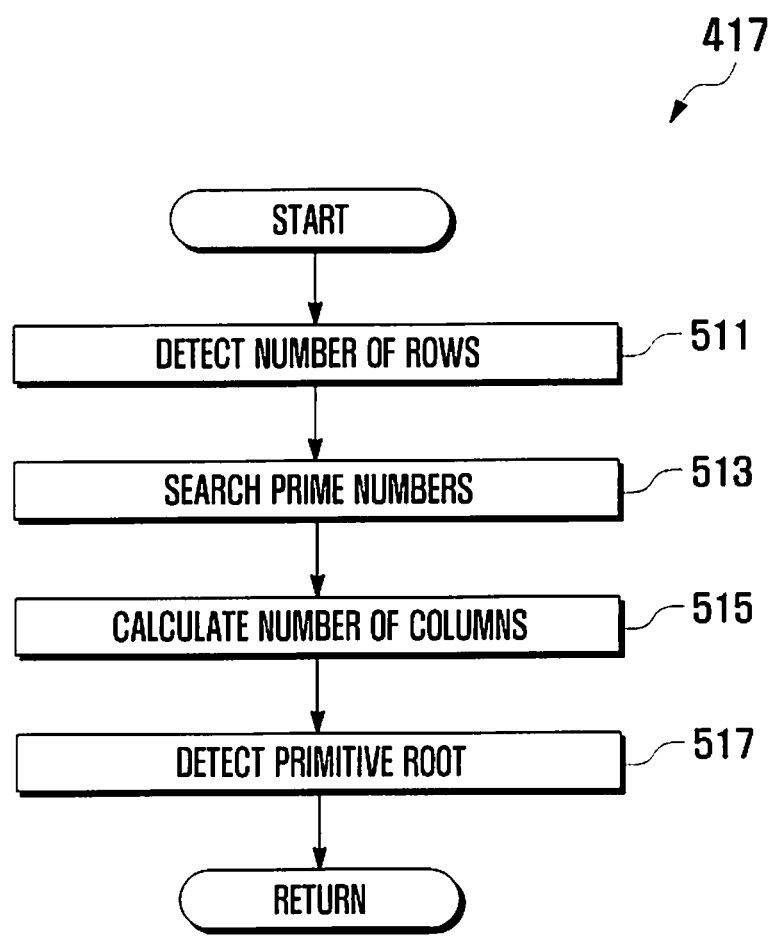
FIG. 6 is a flowchart illustrating steps of the interleaving parameter initialization process of FIG. 5, according to an embodiment of the present invention.

FIG. 6 is a flowchart illustrating steps of the interleaving parameter initialization process of FIG. 5, and FIG. 7 is diagram illustrating graphs for explaining the prime number search process of FIG. 6.

Referring to FIG. 6, the parameter initializer 330 detects the number of rows of the rectangular matrix from the new interleaving size in step 511. The parameter initializer 330 checks the number of rows corresponding to the new interleaving size according to predetermined conditions shown in Equation (1). The parameter initializer 330 determines the row index (i) from 0 to R−1 in the rectangular matrix.

$$R = \begin{cases} 5, & \text{if } 40 \leq K \leq 159 \\ 10, & \text{if } 160 \leq K \leq 200 \text{ or } 481 \leq K \leq 530 \\ 20, & \text{if } K = \text{any other value} \end{cases} \quad (1)$$

The parameter initializer 330 searches for the prime number with the new interleaving size and the number of rows in step 513. The interleaving size and prime index have the relationship characterized by stepwise lines, as shown in FIG. 7. As shown in graph (a) of FIG. 7, when the number of rows is 5, the interleaving size can be in the range of 40 to 159, and the prime index can be in the range of 0 to 8. As shown in graph (b) of FIG. 7, when the number of rows is 10, the interleaving size can be in the range of 160 to 200, and the prime index can be in 3 or 4. As shown in graph (c) of FIG. 7, when the number of rows is 20, the interleaving size can be in the range of 201 to 5114, and the prime index can be in the range of 1 to 51.

The parameter initializer 330 determines a group corresponding to the number of rows with reference to a predetermined group table as shown in Table 1. Specifically, the parameter initializer 330 checks the size range ($x_1$, $x_2$) and the index range ($y_1$, $y_2$) corresponding to the new interleaving size. The parameter initializer 330 also calculates the prime index (p index; y) predicted to correspond to the prime number expected to be searched with the new interleaving size using Equation (2). In this manner, the parameter initializer 330 can obtain a straight line in the size range and prime index range corresponding to the number of rows as shown in the form of dotted lines in FIG. 7. Also, the parameter initializer 330 can calculate the prime indices as shown in the form of solid lines in FIG. 7.

TABLE 1

| R | $X_1 \leq K \leq X_2$ | | $y_1 \leq K \leq y_2$ | |
|---|---|---|---|---|
|   | $x_1$ | $x_2$ | $y_1$ | $y_2$ |
| 5 | 40 | 168 | 0 | 8 |
| 10 | 160 | 224 | 3 | 4 |
| 20 | 200 | 5100 | 1 | 51 |

$$y = \frac{y_2 - y_1}{x_2 - x_1}(K - x_1) + y_1 \quad (2)$$

The parameter initializer 330 also calculates the prime number fulfilling the predetermined conditions of Equation (3). Specifically, the parameter initializer 330 searches for the prime number corresponding to the prime index. If the new interleaving size satisfies the condition $481 \leq K \leq 530$, the parameter initializer 330 can select the prime number '53' according to the conditions of Equation (3) without determining a group corresponding to the number of rows or calculating the prime index.

if $481 \leq K \leq 530, p = 53$ if $K$ = any other value, $K \leq R \times (p+1)$ (3)

For example, if the new interleaving size is 156, the parameter initializer 330 retrieves the prime index '7' and starts search from the prime number '31' corresponding the prime index '7'. Specifically, the parameter initializer 330 searches for the minimum prime number satisfying the conditions of Equation (3), increasing the prime index by 1 from 7.

Also, the parameter initializer 330 calculates a new interleaving size, a number of rows and a number of columns (prime number) of the rectangular matrix. The parameter initializer 330 calculates the number of columns from the prime number under predetermined conditions of Equation (4), in step 515 of FIG. 6. The parameter initializer 330 can determine the indexes of 0 to C−1 columns from the left to the right.

if $481 \leq K \leq 530, \; C = p$ (4)

if $K$ = any other value, $C = \begin{cases} p - 1, & \text{if } K \leq R \times (p-1) \\ p, & \text{if } R \times (p-1) < K \leq R \times p \\ p + 1, & \text{if } R \times p < K \end{cases}$ After obtaining the number of columns, the parameter initializer 330 calculates the primitive root with the prime number in step 517 of FIG. 6. At this time, the parameter initializer retrieves the primitive root corresponding to the prime number from a predetermined look-up table as shown in Table 2.

TABLE 2

| y | p | v |
|---|---|---|
| 0 | 7 | 3 |
| 1 | 11 | 2 |
| 2 | 13 | 2 |
| 3 | 17 | 3 |
| 4 | 19 | 2 |
| 5 | 23 | 5 |
| 6 | 29 | 2 |
| 7 | 31 | 3 |
| 8 | 37 | 2 |

TABLE 2-continued

| y | p | v |
|---|---|---|
| 9 | 41 | 6 |
| 10 | 43 | 3 |
| 11 | 47 | 5 |
| 12 | 53 | 2 |
| 13 | 59 | 2 |
| 14 | 61 | 2 |
| 15 | 67 | 2 |
| 16 | 71 | 7 |
| 17 | 73 | 5 |
| 18 | 79 | 3 |
| 19 | 83 | 2 |
| 20 | 89 | 3 |
| 21 | 97 | 5 |
| 22 | 101 | 2 |
| 23 | 103 | 5 |
| 24 | 107 | 2 |
| 25 | 109 | 6 |
| 26 | 113 | 3 |
| 27 | 127 | 3 |
| 28 | 131 | 2 |
| 29 | 137 | 3 |
| 30 | 139 | 2 |
| 31 | 149 | 2 |
| 32 | 151 | 6 |
| 33 | 157 | 5 |
| 34 | 163 | 2 |
| 35 | 167 | 5 |
| 36 | 173 | 2 |
| 37 | 179 | 2 |
| 38 | 181 | 2 |
| 39 | 191 | 19 |
| 40 | 193 | 5 |
| 41 | 197 | 2 |
| 42 | 199 | 3 |
| 43 | 211 | 2 |
| 44 | 223 | 3 |
| 45 | 227 | 2 |
| 46 | 229 | 6 |
| 47 | 233 | 3 |
| 48 | 237 | 7 |
| 49 | 241 | 7 |
| 50 | 251 | 6 |
| 51 | 257 | 3 |

For example, if the interleaving size is 40, the parameter initializer 330 retrieves the number of columns '5' based on the interleaving size '40'. The parameter initializer 330 retrieves the prime number '7' by searching with the new interleaving size '40' and number of column '5'. Since the value obtained by multiplying the number of rows '5' and the prime number '7' is less than 40, the parameter initializer 330 calculates the number of columns as '8'. The parameter initializer 330 also calculates the primitive root as '3' corresponding to the prime number '7'. In this manner the parameter initializer 330 calculates the interleaving parameters for a rectangular matrix shown below.

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |

Returning to FIG. 5, after initializing the interleaving parameters at step 417, the parameter comparator 350 of the turbo interleaver 220 compares the new interleaving parameters and the old interleaving parameter stored in the parameter memory 340 and determines whether the new and old interleaving parameters are equal to each other in step 419.

If the new and old interleaving parameters are not equal to each other, the sequence generator 360 of the turbo interleaver 220 generates interleaving sequences with the new interleaving parameters in step 421. The old interleaving parameters stored in the parameter memory 340 are updated with the new interleaving parameters. The sequence generator 360 generates the interleaving sequences with the new interleaving parameters in the rectangular matrix. The interleaving sequences include a base sequence, a minimum sequence, and a permutation sequence.

FIG. 8 is a flowchart illustrating steps of the interleaving sequence generation process of FIG. 5.

Referring to FIG. 8, the sequence generator 360 calculates the base sequence for intra-row permutation in step 611. The sequence generator 360 can calculate the base sequence with the new interleaving parameters as shown in Equation (5). The sequence generator 360 calculates the minimum sequence in step 613. Specifically, the sequence generator 360 calculates the minimum sequence with the minimum prime integers for individual rows. The sequence generator 360 can calculate the minimum sequence with the prime numbers among the new interleaving parameters using Equation (6). The sequence generator 360 generates the permutation sequence in step 615, as shown in Equation (7). The permutation sequence can be calculated with permuted prime integers for individual rows.

$$\langle s(j) \rangle_{j \in 0,1,\ldots,p-2} = \begin{cases} s(0) = 1 \\ s(j) = (v \times s(j-1)) \bmod p, \quad j = 1, 2, \ldots, (p-2) \end{cases} \quad (5)$$

$$g.c.d(q_i, p-1) = 1, q_i > 6, \quad (6)$$
$$\text{and } q_i > q_{(i-1)} \text{ for each } i = 1, 2, \ldots, R-1$$

where g.c.d denotes a greatest common divisor.

$$r_{T(i)} = q_i, i = 1, 2, \ldots, R-1 \quad (7)$$

Where T(i) denotes an inter-row permutation pattern for inter-row permeation. The inter-row permutation pattern can be determined depending on the new interleaving size as shown in Table 3.

TABLE 3

| Interleaving size | Number of rows | Permutation patterns <T(10), T(1), ..., T(R − 1)> |
|---|---|---|
| 40 ≤ K ≤ 159 | 5 | <4, 3, 2, 1, 0> |
| 160 ≤ K ≤ 200 or 481 ≤ K ≤ 530c | 10 | <9, 8, 7, 6, 5, 4, 3, 2, 1, 0> |
| 2281 ≤ K ≤ 2480 or 3161 ≤ K ≤ 3210 | 20 | <19, 9, 14, 4, 0, 2, 5, 7, 12, 18, 16, 13, 17, 15, 3, 1, 6, 11, 8, 10> |
| K = any other value | 30 | <19, 9, 14, 4, 0, 2, 5, 7, 12, 18, 10, 8, 13, 17, 3, 1, 16, 6, 15, 11> |

For example, if the new interleaving size is 40, the number of rows is 5, the prime number is 7, the number of columns is 8, and the primitive root is 3; the sequence generator 360 generates a base sequence of '3 2 6 4 5'. The sequence generator 360 generates a minimum sequence of '1 7 11 13 17'. Also, the sequence generator 360 generates a permutation sequence of '17 13 11 7 1' using the permutation patterns <4, 3, 2, 1>.

Returning to FIG. 5, after the turbo interleaver 220 generates the interleaving sequences, the address generator 370 of the turbo interleaver 220 generates interleaved addresses according to the interleaving sequences of the rectangular matrix in step 423. The address generator 370 performs at least one of intra-row permutation and inter-row permutation according to the interleaving sequences and, as a consequence, checks the interleaved address. The address generator 370 can perform pruning to recheck the interleaved address. Specifically, the address generator 370 compares the interleaved address with the interleaving size to determine whether to perform pruning on the interleaved address. If the interleaved address is longer than the interleaving size, the address generator 370 performs pruning on the interleaved address.

If it is determined that the new interleaving parameters are equal to the old interleaving parameters stored in the parameter memory 340 at step 419, the address generator 370 of the turbo interleaver 220 generates the interleaved address according to the interleaving sequence in the rectangular matrix in step 423. This means that the sequence generator 360 does not generate the interleaving sequence with the new interleaving parameters. The sequence generator 360 provides the address generator 370 with the interleaving sequences corresponding to the interleaving parameters stored in the parameter memory 340. The address generator 370 generates the interleaved addresses based on the interleaving sequences provided by the sequence generator 360.

FIG. 9 is a flowchart illustrating steps of the interleaved address generation process of FIG. 5.

Referring to FIG. 9, the address generator 370 generates an intra-row matrix (U) by performing intra-row permutation in the rectangular matrix in step 711. The address generator 370 performs the intra-row permutation using base sequence, permutation sequence, interleaving parameters, and particularly prime number as shown in Equation (8). The address generator 370 generates an inter-row matrix by performing inter-row permutation in the rectangular matrix in step 713. The address generator 370 can perform the inter-row permutation according to the permutation pattern. The address generator 370 also checks the interleaved addresses from the inter-row matrix in step 715. The address generator 370 can regard the individual columns of the inter-row matrix as interleaved addresses.

if C=p, $$U_i(j)=s((j \times r_i) \mod (p-1)), j=0,1,\ldots,(p-2), U_i(p-1)=0$$

if C=p+1, $$U_i(j)=s((j \times r_i) \mod (p-1)), j=0,1,\ldots,(p-2), U_i(p-1)=0, U_i(p)=p$$

if C=p-1, $$U_i(j)=s((j \times r_i) \mod (p-1))-1, j=0,1,\ldots,(p-2) \qquad (8)$$

For example, if the new interleaving size is 40, the number of rows is 5, the prime number is 7, the number of column is 8, and the primitive root is 3; the address generator 370 generates the intra-row matrix shown below.

| 1  | 5  | 4  | 6  | 2  | 3  | 0  | 7  |
|----|----|----|----|----|----|----|----|
| 9  | 11 | 10 | 14 | 12 | 13 | 8  | 15 |
| 17 | 21 | 20 | 22 | 18 | 19 | 16 | 23 |
| 25 | 27 | 26 | 30 | 28 | 29 | 24 | 31 |
| 39 | 35 | 34 | 38 | 36 | 37 | 32 | 33 |

The address generator 370 also can generate the inter-row matrix shown below. The address generator 370 can retrieves the interleaved address in the inter-row matrix.

| 39 | 35 | 34 | 38 | 36 | 37 | 32 | 33 |
|----|----|----|----|----|----|----|----|
| 25 | 27 | 26 | 30 | 28 | 29 | 24 | 31 |
| 17 | 21 | 20 | 22 | 18 | 19 | 16 | 23 |

-continued

| 9 | 11 | 10 | 14 | 12 | 13 | 8 | 15 |
|---|----|----|----|----|----|---|----|
| 1 | 5  | 4  | 6  | 2  | 3  | 0 | 7  |

Here, the address generator 370 can retrieve the interleaved addresses of '39 25 17 9 1', '35 27 21 11 1', '34 26 20 10 4', '38 30 22 14 6', '36 28 18 12 2', '37 29 19 13 3', '32 24 16 8 0', and '33 31 23 15 7'.

Once the interleaved addresses are obtained, the address generator 370 compares the interleaved addresses with the interleaving size to determine whether each interleaved address is longer than the interleaving size in step 717. If the interleaved address is not longer than the interleaving size, the address generator 370 returns the process to repeat steps 711 to 717 to perform pruning. Otherwise, if the interleaved address is longer than the interleaving size, the address generator 370 ends the address generating process.

Returning to FIG. 5, after the address generator 370 generates the interleaved addresses, the address determiner 390 of the turbo interleaver 220 determines the new interleaved addresses as current interleaved addresses in step 425. As a consequence, the address determiner 390 updates the old interleaved addresses stored in the address memory 380 with the new interleaved addresses. The turbo decoder performs decoding on the received data using the new interleaved addresses in step 427.

If it is determined that the two interleaving sizes are equal to each other at step 415, the address determiner 390 of the turbo interleaver 220 determines the current interleaved address in step 425. The address determiner 390 determines the old interleaved addresses stored in the address memory 380 as the current interleaved addresses. This means that the parameter initializer 330, parameter comparator 350, sequence generator 360, and address generator 370 are interoperating with each other. The turbo decoder performs decoding the received data with the current interleaved addresses.

Specifically, the turbo interleaver 220 of the turbo decoder can determine the interleaved addresses selectively in specific code block. When the interleaved addresses are changed between two contiguous TTIs or two contiguous code blocks, the turbo interleaver 220 determines the interleaved addresses.

Figure 10:
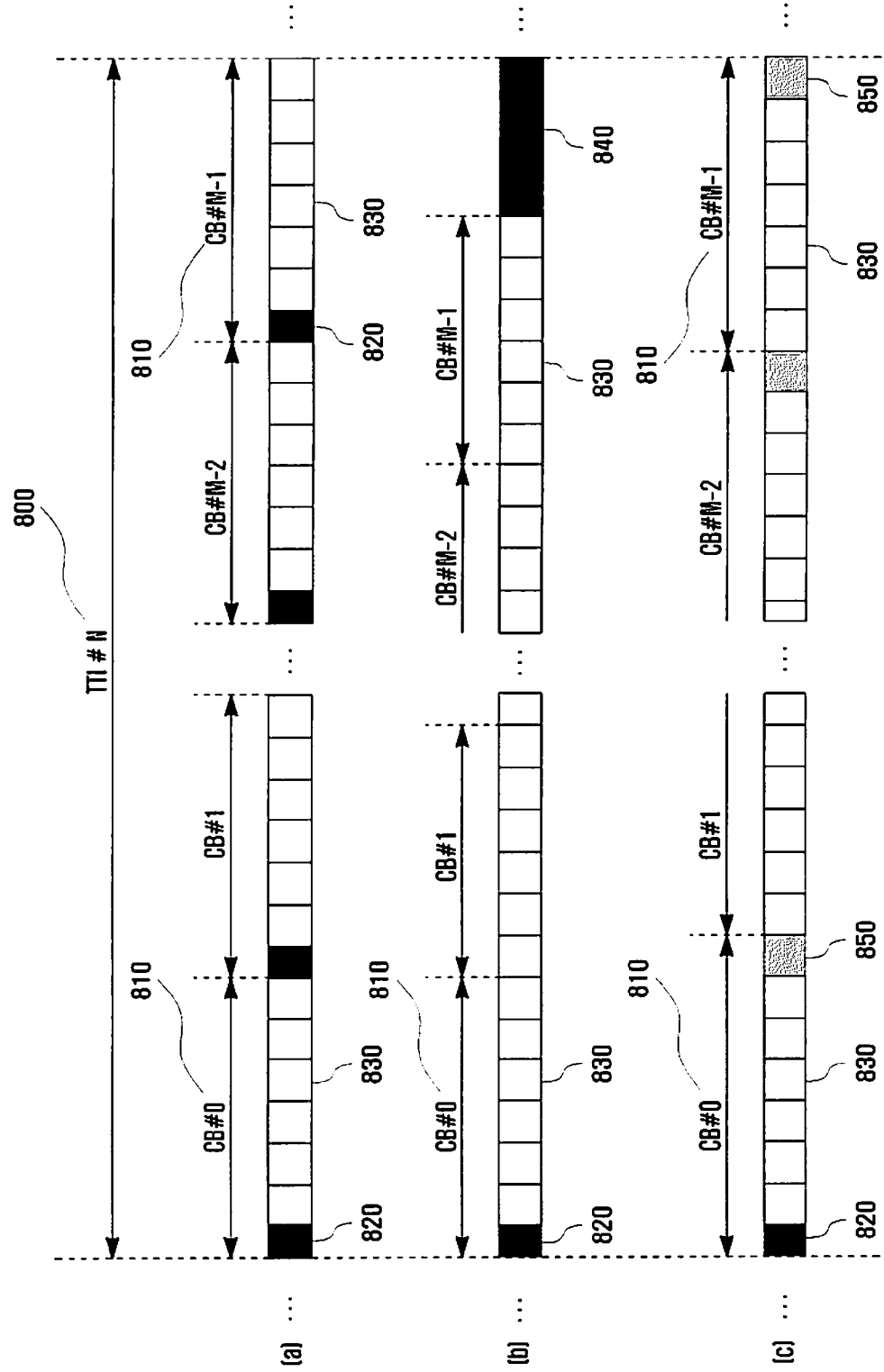
FIG. 10 is a diagram illustrating operations of turbo decoding in a digital communication system, according to an embodiment of the present invention.

FIG. 10 is a diagram illustrating operations of turbo decoding in a digital communication system, according to an embodiment of the present invention. Part (a) of FIG. 10 shows a conventional turbo decoding process, and parts (b) and (c) of FIG. 10 show turbo decoding processes according to an embodiment of the present invention. The description is made of a decoding process in $N^{th}$ TTI (TTI#N) as denoted by reference number 800.

The $N^{th}$ TTI includes a plurality of code blocks (CB#0, CB#1, ..., CB#M-2, and CB#M-1), and each of the code blocks includes an address generation period 820 for generating interleaved addresses and a plurality of iterative decoding periods 830 in the conventional turbo decoding process as shown in part (a) of FIG. 10. In an embodiment of the present invention as depicted in parts (b) and (c) of FIG. 10, however, each code block can be composed of a plurality of decoding periods with or without an address generation period 820 (see the code block 810 and code block 830). This is because the turbo encoder 220 can determine the interleaved addresses even though the interleaved addresses are not generated in every code block. Specifically, if the interleaving size is not changed in the $N^{th}$ TTI 800, the turbo interleaver 220 can use the interleaved addresses generated at the first code block 810 for other code blocks.

Since the address generation period is negated in at least one code block, there occurs at least one idle period in the $N^{th}$ TTI 800. Such idle periods can be arranged at the end of the $N^{th}$ TTI 800 to be used as a standby period 840. The turbo decoder stops turbo decoding for the standby period 840, resulting in reduction of power consumption. As shown in part (c) of FIG. 10, the idle periods can be used as an additional decoding period 850 of each code block, resulting in improvement of decoding performance.

Figure 11:
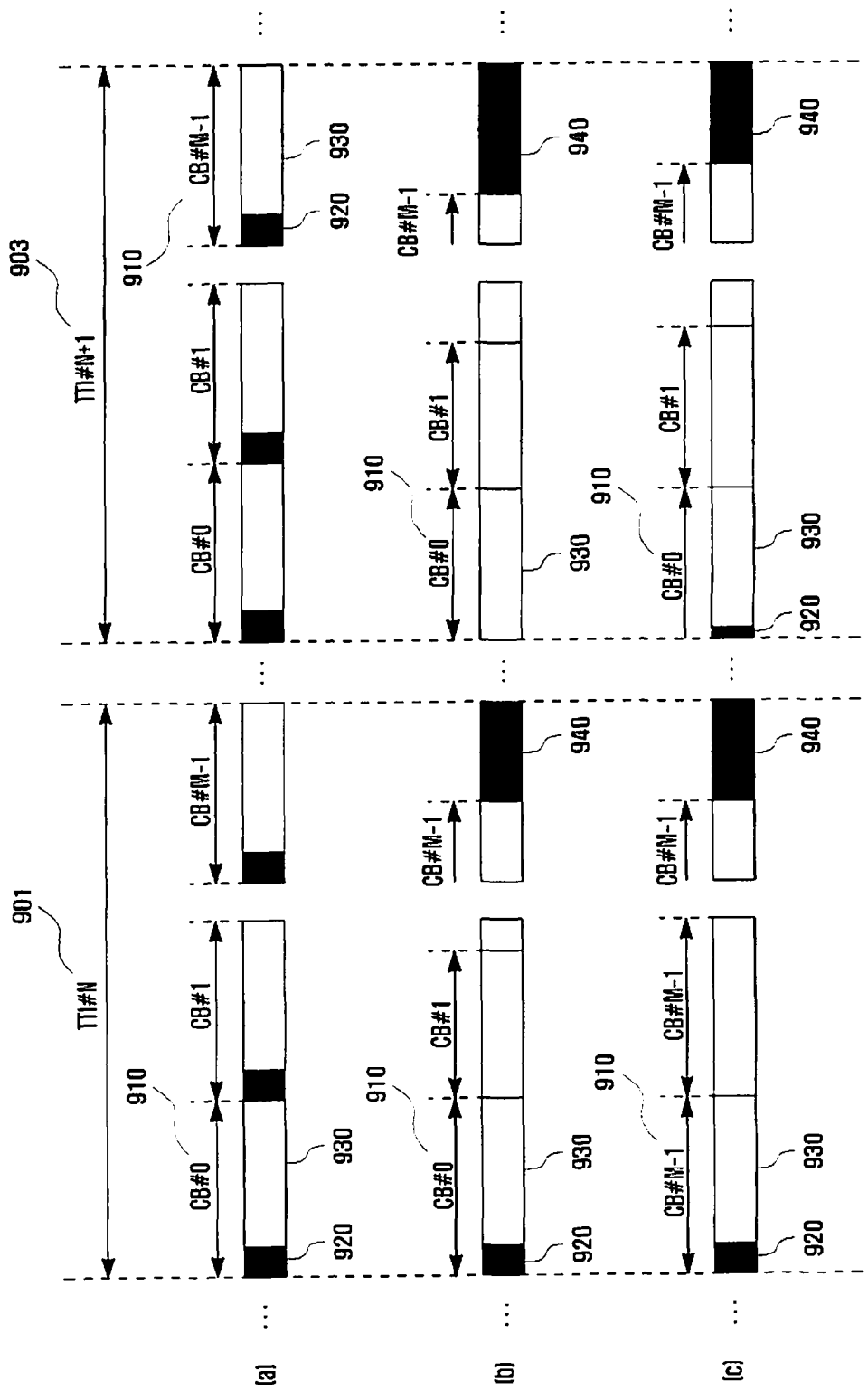
FIG. 11 is a diagram illustrating operations of turbo decoding in a digital communication system, according to another embodiment of the present invention.

FIG. 11 is a diagram illustrating exemplary operations of turbo decoding in a digital communication system according to another embodiment of the present invention. Part (a) of FIG. 11 shows a conventional turbo decoding process, and parts (b) and (c) of FIG. 11 show turbo decoding processes according to another embodiment of the present invention. The description is made of a decoding process in $N^{th}$ and $(N+1)^{th}$ TTIs 901 and 903.

A TTI includes a plurality of code blocks (CB#0, CB#1, . . . , CB#M−2, and CB#M−1), and each of the code blocks includes an address generation period 920 and an decoding period 930 composed of a plurality of iterative decoding periods sections in the conventional turbo decoding process as shown in part (a) of FIG. 11. In an embodiment of the present invention as depicted in parts (b) and (c) of FIG. 11, however, each code block can be composed of a decoding period with or without address generation period 920. This is because the turbo encoder 220 can determine the interleaved addresses even though the interleaved addresses are not generated in every code block in the $N^{th}$ and $(N+1)^{th}$ TTIs 901 and 903.

If the interleaving size is not changed between the $N^{th}$ and $(N+1)^{th}$, the turbo interleaver 220 can skip generating the interleaved addresses for the $(N+1)^{th}$ TTI 903 as shown in part (b) of FIG. 11. Also, if the interleaving parameters are not changed between the $N^{th}$ and $(N+1)^{th}$, the turbo interleaver 220 can generate the interleaved addresses at the first code block 910 of the $(N+1)^{th}$ TTI 903 as shown in part (c) of FIG. 11. In this case, however, the address generation period 920 of the $(N+1)^{th}$ TTI 903 is shorter than that of the $N^{th}$ TTI 901.

Since the address generation period is negated in at least one code block, there occurs at least one idle period in the $N^{th}$ and $(N+1)^{th}$ TTIs 901 and 903. Such idle periods can be arranged at the ends of the $N^{th}$ and $(N+1)^{th}$ TTIs 901 and 903 to be used as standby periods 940 as shown in the parts (b) and (c) of FIG. 11. The turbo decode stops turbo decoding for these standby periods 940, resulting in reduction of power consumption.

As described above, the interleaved address determination method and apparatus of the present invention is capable of reducing the time for the turbo interleaver to generate interleaved addresses. In the interleaved address determination method and apparatus of the present invention, the turbo interleaver can perform decoding data by generating interleaved addresses at minimum number of code blocks, resulting in reduction of decoding delay and improvement of decoding performance.

While the present invention has been described with reference to certain embodiments thereof, it will be understood by those skilled in the art that various changes in form and detail may be made therein without departing from the spirit and scope of the present invention, as defined in the appended claims.

What is claimed is:

1. A method for determining interleaved addresses of a turbo interleaver, comprising the steps of:
   receiving data;
   determining whether a new interleaving size of the received data is equal to a previously-stored interleaving size;
   when the new interleaving size is equal to the previously-stored interleaving size, decoding the received data using previously-stored interleaved addresses without calculating a new interleaved address; and
   when the new interleaving size is not equal to the previously-stored interleaving size:
      calculating new interleaving parameters with the new interleaving size;
      determining whether the new interleaving parameters are equal to previously-stored interleaving parameters;
      when the new interleaving parameters are equal to the previously-stored interleaving parameters, calculating new interleaved addresses with previously-stored interleaving sequences; and
      decoding the received data using the new interleaved addresses.

2. The method of claim 1, further comprising:
   when the new interleaving parameters are equal to the previously-stored interleaving parameters, updating the previously-stored interleaved addresses with the new interleaved addresses.

3. The method of claim 1, further comprising updating the previously-stored interleaving size with the new interleaving size.

4. The method of claim 2, further comprising:
   when the new interleaving parameters are not equal to the previously-stored interleaving parameters, generating new interleaving sequences with the new interleaving parameters and generating the new interleaved addresses with the new interleaving sequences.

5. The method of claim 2, further comprising updating the previously-stored interleaving parameters with the new interleaving parameters when the new interleaving parameters are different from the previously-stored interleaving parameters.

6. The method of claim 2, wherein the new and previously-stored interleaving parameters comprise a number of rows, a number of columns, prime numbers, and a primitive root of a rectangular matrix to be formed with the received data, and wherein calculating the new interleaving parameters comprises:
   predicting prime indexes with the new interleaving size and the number of rows; and
   detecting a minimum value satisfying a predetermined condition by scanning prime numbers corresponding to the prime indexes.

7. An apparatus for determining interleaved addresses of a turbo interleaver, comprising:
   a size memory for storing interleaving sizes;
   a size comparator that receives data and determines whether a new interleaving size of the received data is equal to a previously-stored interleaving size in the size memory;
   a parameter memory for storing interleaving parameters;
   a parameter initializer that calculates new interleaving parameters with the new interleaving size when the new interleaving size is not equal to the previously-stored interleaving size;
   a parameter comparator that determines whether the new interleaving parameters are equal to previously-stored interleaving parameters in the parameter memory when the new interleaving size is not equal to the previously-stored interleaving size;
   an address generator that calculates new interleaved addresses with previously-stored interleaving sequences when the new interleaving parameters are equal to previously-stored interleaving parameters; and an address determiner that decodes the received data using previously-stored addresses in an address memory without calculating a new interleaved address in the address generator when the new interleaving size is equal to the previously-stored interleaving size, and decodes the received data using the new interleaved addresses when the new interleaving size is not equal to the previously-stored interleaving size.

8. The apparatus of claim 7, wherein the address generator updates the previously-stored interleaved addresses in the address memory with the new interleaved addresses when the new interleaving parameters are equal to the previously-stored interleaving parameters.

9. The apparatus of claim 7, wherein the size comparator updates the previously-stored interleaving size in the size memory with the new interleaving size when the new interleaving size is not equal to the previously-stored interleaving size.

10. The apparatus of claim 8, further comprising a sequence generator that generates new interleaving sequences with the new interleaving parameters when the new interleaving parameters are not identical to the previously-stored interleaving parameters, wherein the address generator calculates the new interleaved addresses with the new interleaving sequences for decoding the received data.

11. The apparatus of claim 8, wherein the parameter comparator updates the previously-stored interleaving parameters in the parameter memory with the new interleaving parameters when the new interleaving parameters are different from the previously-stored interleaving parameters.

12. The apparatus of claim 8, wherein the new and previously-stored interleaving parameters comprise a number of rows, a number of columns, prime numbers, and a primitive root of a rectangular matrix to be formed with the received data, and the parameter initializer predicts prime indexes with the new interleaving size and the number of rows and detects a minimum value satisfying a predetermined condition by scanning prime numbers corresponding to the prime indexes.

* * * * *